United States Patent
Wu et al.

(10) Patent No.: US 9,225,161 B2
(45) Date of Patent: Dec. 29, 2015

(54) SHORT CIRCUIT PROTECTION CIRCUIT AND METHOD FOR INSULATED GATE BIPOLAR TRANSISTOR

(71) Applicant: GE ENERGY POWER CONVERSION TECHNOLOGY LIMITED, Warwickshire (GB)

(72) Inventors: Tao Wu, Nanjing Jiangsu (CN); Yingqi Zhang, Shanghai (CN); Fan Zhang, Shanghai (CN)

(73) Assignee: GE ENERGY POWER CONVERSION TECHNOLOGY LTD. (GB)

( * ) Notice: Subject to any disclaimer, the term of this patent is extended or adjusted under 35 U.S.C. 154(b) by 0 days.

(21) Appl. No.: 14/172,563

(22) Filed: Feb. 4, 2014

(65) Prior Publication Data

US 2014/0218833 A1  Aug. 7, 2014

(30) Foreign Application Priority Data

Feb. 5, 2013  (CN) .......................... 2013 1 0046177

(51) Int. Cl.
*H02H 7/00* (2006.01)
*H02H 9/02* (2006.01)
*H03K 17/082* (2006.01)
*H03K 17/10* (2006.01)

(52) U.S. Cl.
CPC ............. *H02H 9/02* (2013.01); *H03K 17/0828* (2013.01); *H03K 17/107* (2013.01)

(58) Field of Classification Search
USPC .................................................. 361/18, 93.1
See application file for complete search history.

(56) References Cited

U.S. PATENT DOCUMENTS

| | | | |
|---|---|---|---|
| 4,954,917 A | 9/1990 | Wirth | |
| 5,444,591 A | 8/1995 | Chokhawala | |
| 5,485,341 A | 1/1996 | Okado et al. | |
| 5,566,063 A | 10/1996 | Gerster | |
| 6,104,149 A | 8/2000 | Pelly | |
| 6,275,093 B1 | 8/2001 | Shekhawat et al. | |
| 6,501,128 B1 | 12/2002 | Otsuki | |
| 6,921,687 B2 | 7/2005 | Hattori et al. | |
| 2002/0074974 A1* | 6/2002 | Shinba | 322/37 |
| 2007/0063269 A1 | 3/2007 | Ng et al. | |
| 2012/0218669 A1 | 8/2012 | Ioannidis | |

(Continued)

OTHER PUBLICATIONS

EP Search Report issued in connection with corresponding EP Patent Application No. 14153111.1 dated Apr. 2, 2014.

(Continued)

*Primary Examiner* — Ronald W Leja
(74) *Attorney, Agent, or Firm* — GE Global Patent Operation; Catherine J. Toppin

(57) ABSTRACT

An assembly includes an insulated gate bipolar transistor (IGBT), a gate driver and a short-circuit protection circuit. The gate driver is adapted to supply voltage to a gate terminal of the IGBT. The short-circuit protection circuit includes an IGBT short-circuit detector for determining whether the IGBT is short-circuited, and a supply voltage regulator for regulating the supply voltage in response to the IGBT short-circuit detector determining that the IGBT is short-circuited.

16 Claims, 13 Drawing Sheets

(56) References Cited

U.S. PATENT DOCUMENTS

| | | |
|---|---|---|
| 2012/0242376 A1 | 9/2012 | Ose et al. |
| 2013/0021702 A1* | 1/2013 | Waltman et al. ............. 361/91.1 |
| 2013/0083576 A1* | 4/2013 | Gan ...................... H02M 1/088 363/123 |
| 2014/0003103 A1* | 1/2014 | Aaltio ........................ 363/56.03 |
| 2014/0168840 A1* | 6/2014 | Hafner et al. ................... 361/86 |
| 2014/0218833 A1* | 8/2014 | Wu et al. ...................... 361/93.1 |

OTHER PUBLICATIONS

Chimento et al., "Robustness Evaluation of High-Voltage Press-Pack IGBT Modules in Enhanced Short-Circuit Test", Industry Applications, IEEE Transactions, vol. No. 48, Issue No. 03, pp. 1046-1053, May-Jun. 2012.

\* cited by examiner

SHORT CIRCUIT PROTECTION CIRCUIT AND METHOD FOR INSULATED GATE BIPOLAR TRANSISTOR

BACKGROUND

Embodiments of the invention relate generally to a circuit and method for protecting insulated gate bipolar transistors (IGBTs) against short circuit conditions.

An IGBT is a switching transistor used to permit power flow in when it is on and to stop power flow when it is off. It is a solid-state device and has no physical moving parts. Instead of opening and closing a physical connection, the IGBT is operated by applying voltage to a semiconductor component, which changes its properties to create or block an electrical path. IGBTs are commonly used as switches, e.g., in chopper and frequency converter applications to control and convert electrical power by switching electrical devices on and off at predetermined instances.

IGBTs usually are designed to reliably handle circuit currents under normal as well as estimated overload conditions. Generally, to a certain extent, IGBTs are capable of withstanding fault conditions caused by anomalous operations. However, under a fault or short-circuit condition, an IGBT may be subjected to a very high surge current. The short-circuit current may be four times its rated current, resulting in both high voltage and high current simultaneously being applied to the IGBT. The IGBT under the fault or short-circuit condition may be subjected to a power loss with consequent increased thermal stress, which may damage the IGBT. Therefore, protecting IGBTs against short circuit conditions is important.

Existed methods manage to reduce a peak current at the beginning of the short circuit fault by dynamically reducing resistance of a turn-on resistor in a gate driver for the IGBT. However, the short-circuit fault current at a steady state is still not reduced, resulting in the considerable thermal loss during the fault.

As another method to protect against short circuit conditions, U.S. Pat. No. 6,104,149 describes using a shunt resistor in series with the emitter of the IGBT to reduce the overall short-circuit fault current. However, the power loss of the IGBT cannot be significantly reduced through the described method. Instead, adding such a series-connected shunt resistor will increase the power loss, resulting in additional junction temperature increase of the IGBT die if the shunt resistor is embedded into the IGBT die. Moreover, the actual gate voltage cannot be accurately controlled in the described method.

For these and other reasons, there is a need for embodiments of the present invention.

BRIEF DESCRIPTION

In accordance with an embodiment, an assembly including an insulated gate bipolar transistor (IGBT), a gate driver and a short-circuit protection circuit is provided. The gate driver is adapted to supply voltage to a gate terminal of the IGBT. The short-circuit protection circuit includes an IGBT short-circuit detector for determining whether the IGBT is short-circuited, and a supply voltage regulator for regulating the supply voltage in response to the IGBT short-circuit detector determining that the IGBT is short-circuited.

In accordance with another embodiment disclosed herein, a method for protecting an insulated gate bipolar transistor (IGBT) against short circuit conditions is provided. The method includes determining whether the IGBT is short-circuited; and reducing a supply voltage applied to a gate terminal of the IGBT in response to a determination that the IGBT is short-circuited.

In accordance with yet another embodiment disclosed herein, a method for protecting at least two series connected insulated gate bipolar transistors (IGBTs) against short circuit conditions is provided. The method includes determining whether any one of the IGBTs is short-circuited; and reducing supply voltages applied to gate terminals of all the IGBTs in response to a determination that any one of the IGBTs is short-circuited.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of the invention include an assembly including an insulated gate bipolar transistor (IGBT) and a short-circuit protection circuit designed to protect the IGBT against short-circuit failure. When a short circuit occurs, the short circuit level is proportional to a gate voltage applied on the IGBT. The smaller the gate voltage is, the smaller the short circuit current it will be. Since the gate voltage is directly supplied by a supply voltage (drive voltage), a reduction of the supply voltage can lead to a reduction of the gate voltage. In the proposed assembly, the short-circuit protection circuit is configured to reduce the short-circuit current by reducing the supply voltage and thereby reducing the gate voltage applied on the IGBT during a short-circuit fault transient. As such, the power loss of the IGBT during the short-circuit fault transient can be significantly reduced. Thus, both ruggedness and reliability of the IGBT can be guaranteed under the short-circuit condition, and the durability of the IGBT can be significantly enhanced.

Unless defined otherwise, technical and scientific terms used herein have the same meaning as is commonly understood by one of ordinary skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. Moreover, the terms "coupled" and "connected" are not intended to distinguish between a direct or indirect coupling/connection between two components. Rather, such components may be directly or indirectly coupled/connected unless otherwise indicated.

All voltages used herein are measured with respect to a common reference point (or ground, as indicated by ground symbols in FIG. 9), which is coupled to the emitter of the IGBT.

Figure 1:
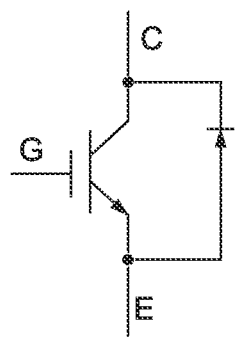
FIG. 1 is a schematic view of an insulated gate bipolar transistor (IGBT).
Figure 2:
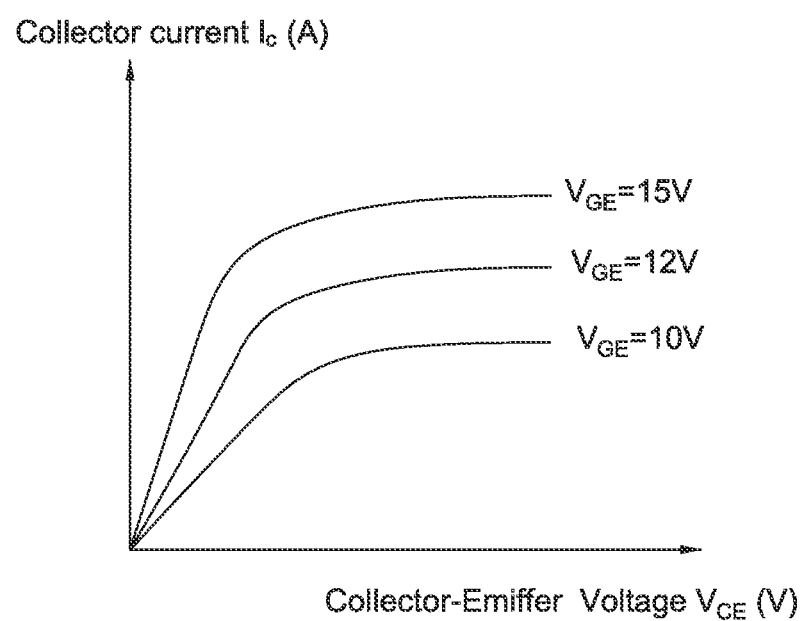
FIG. 2 is a characteristic curve of an IGBT, which shows how the collector current ($I_C$) varies with the collector-emitter voltage ($V_{CE}$) for different values of the gate-emitter voltage ($V_{GE}$).

Referring to FIG. 1, a typical IGBT has three terminals: gate (G), emitter (E) and collector (C), and is characterized by its collector current ($I_C$) decreasing with the decrease of its gate-emitter voltage ($V_{GE}$). The curve in FIG. 2 shows how $I_C$ varies with $V_{GE}$ and the collector-emitter voltage ($V_{CE}$) in an exemplary IGBT. As illustrated, for each specific $V_{GE}$ value, $I_C$ increases with $V_{CE}$ and then reaches a plateau. The level of the short-circuit current is determined by the gate-emitter voltage $V_{GE}$ of the IGBT. There is a decrease in overall $I_C$ when the value of $V_{GE}$ decreases. Thus, the short-circuit current can be reduced by reducing a voltage applied at a gate terminal of the IGBT during a short-circuit fault transient.

Figure 3:
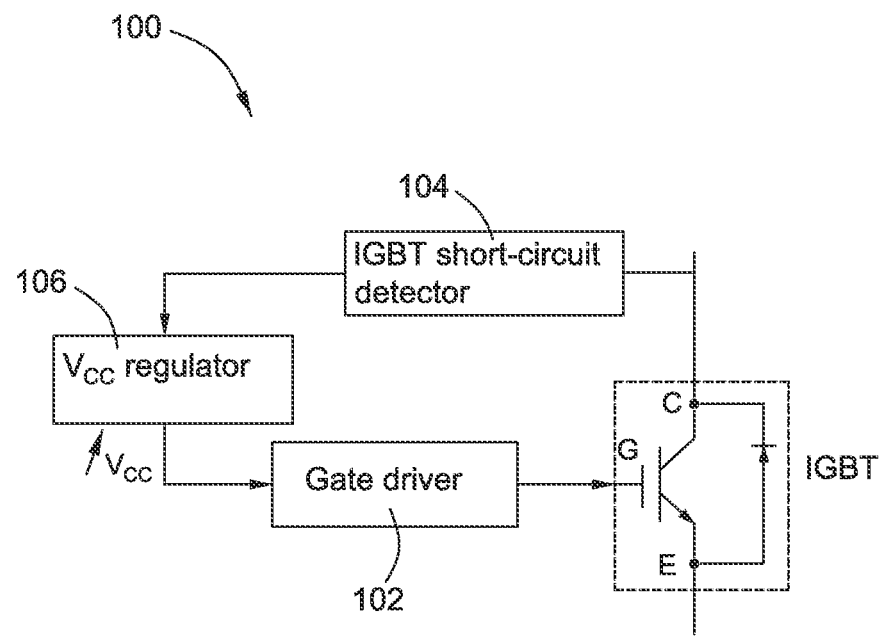
FIG. 3 is a circuit diagram of an exemplary assembly including an IGBT and a short-circuit protection circuit for protecting the IGBT against short-circuit failure, according to an embodiment.

Referring to FIG. 3, an assembly 100 having an IGBT and a short-circuit protection circuit is provided. A gate driver 102 is used to apply a supply voltage ($V_{CC}$) to the gate terminal of the IGBT, which controls the IGBT to be turned on and turned off. The short-circuit protection circuit includes an IGBT short-circuit detector 104 for determining whether the IGBT is short circuited, and a $V_{CC}$ regulator 106 for regulating $V_{CC}$ in response to the detector 104 determining that the IGBT is short-circuited and then turning off the IGBT. Specifically, once a short-circuit fault is sensed, short-circuit protection is activated by driving the $V_{CC}$ regulator 106 to reduce the supply voltage $V_{CC}$ applied to the IGBT and then turn off the IGBT.

In one embodiment, the IGBT short-circuit detector 104 comprises a circuit capable of determining whether a short circuit is occurring by comparing a detected voltage that is proportional to the collector-emitter voltage of the IGBT with a reference voltage. Once the detected voltage is above the reference voltage, a signal is given to indicate that the IGBT is short-circuited. The short-circuit detector 104 may include a reference voltage source for setting a reference voltage, a voltage-steadied circuit coupled at the collector terminal of the IGBT for outputting a detected voltage that is proportional to (but typically much lower than) the collector-emitter voltage of the IGBT, and a comparator for comparing the detected voltage and the reference voltage for supplying a comparison signal. In one example implementation, the short-circuit detector 104 may include at least one diode, at least one resistor, at least one capacitor and at least one comparator (e.g., operational amplifier) (not shown in FIG. 3).

The $V_{CC}$ regulator 106 may be a circuit capable of regulating $V_{CC}$ based on a constant current provided by a power source, and in one example may be implemented by a circuit including at least one capacitor, at least one resistor, at least one controllable electronic switch, at least one transistor and at least one voltage reference generator (not shown in FIG. 3). In some implementations, the $V_{CC}$ regulator 106 includes a voltage divider which is capable of obtaining more than one voltage from a single power source. The voltage divider may include one or more resistors connected in series, with two terminal contacts and one or more middle contacts. As current flows through the one or more resistors, different voltages can be obtained between different contacts. Details about the voltage divider will be illustrated hereinafter in conjunction with FIG. 9. In some implementations, the $V_{CC}$ regulator 106 includes at least two voltage reference generators, which provide relatively higher and lower voltage reference values for generating relatively higher and lower supply voltages, respectively, details of which will be illustrated hereinafter in conjunction with FIG. 10.

Figure 4:
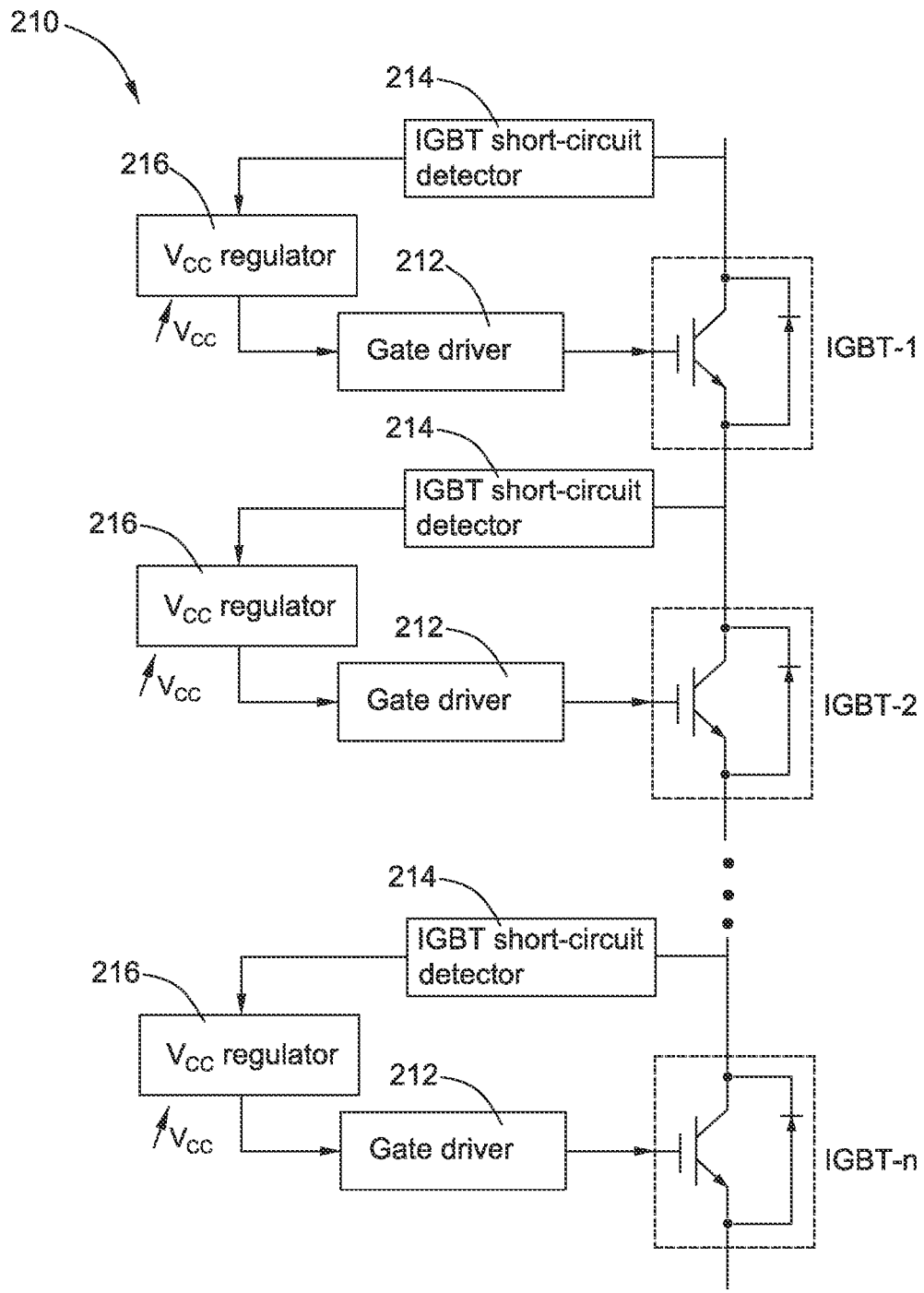
FIG. 4 is a circuit diagram of an exemplary assembly including series connected IGBTs, each of which is associated with a short-circuit protection circuit similar to that of FIG. 3.

In some circumstances when high levels of electrical power may flow through the IGBT that serves as a switch, two or more IGBTs may be connected in series as a single switch to reduce the voltage value on each of the series connected IGBTs and therefore, avoid damaging the IGBTs because of the high levels of electrical power. Referring to FIG. 4, in an exemplary assembly 210, IGBT-1, IGBT-2 . . . IGBT-n are connected in series, and each of the IGBTs is associated with a gate driver 212 and a short-circuit protection circuit, including an IGBT short-circuit detector 214 and a $V_{CC}$ regulator 216, which are similar to these as described above.

Figure 5:
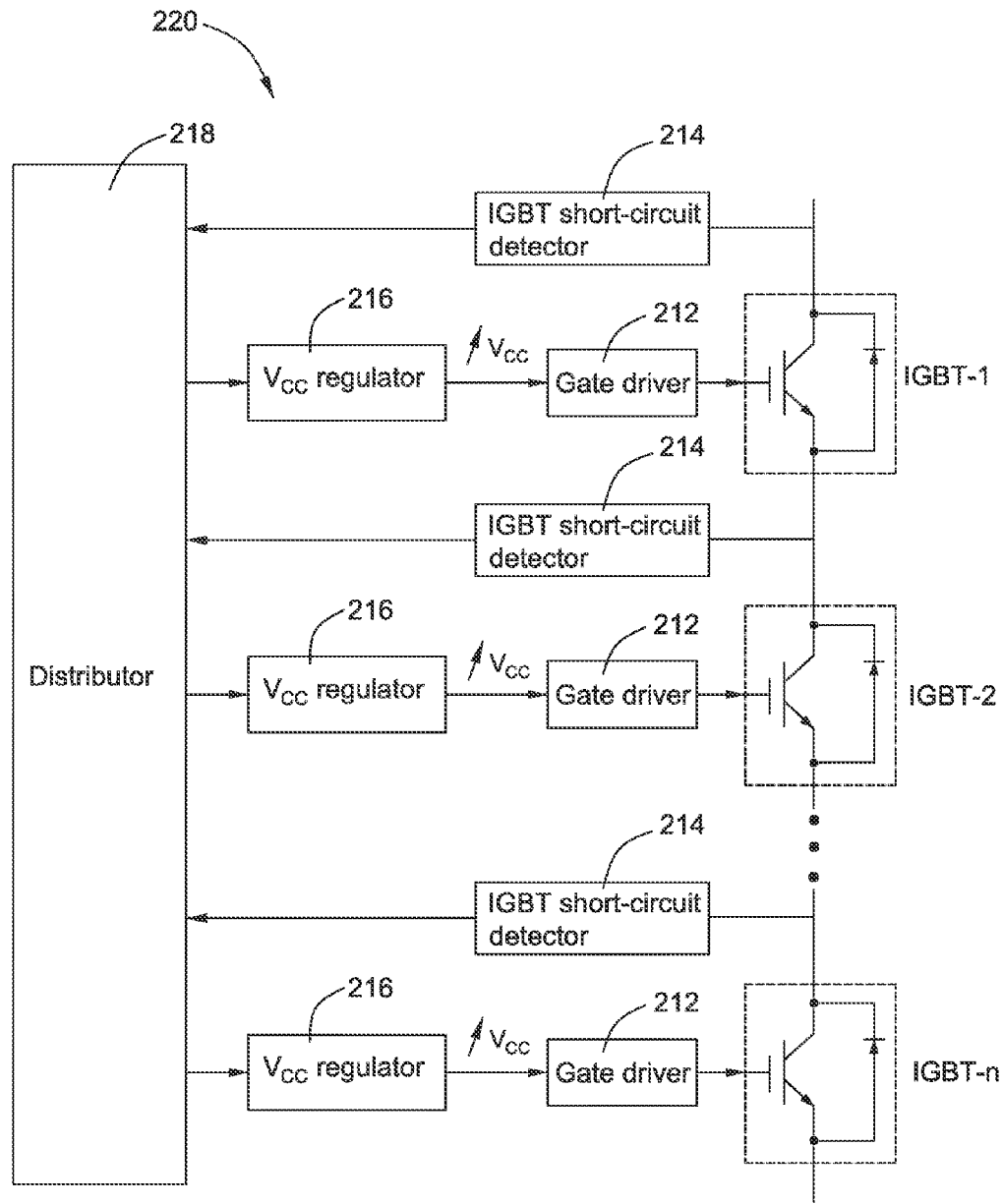
FIG. 5 is a circuit diagram of another exemplary assembly including series connected IGBTs, each of which is associated with a short-circuit protection circuit similar to that of FIG. 3.

A possible issue which may occur with multiple series-connected IGBTs during the short circuit fault is that the voltage imbalance among the IGBTs may result in different triggering times of short circuit protection among the IGBTs. In order to prevent any single IGBT exceeding its breakdown voltage due to the unsynchronized triggering times of the short-circuit protection, in one embodiment, the protection circuits are used to provide the short-circuit protection for all the series-connected IGBTs at the same time. In this embodiment, all the IGBTs are turned off at the same time during the short-circuit protection. An example of such an embodiment is illustrated in FIG. 5. Compared with the assembly 210 of FIG. 4, an assembly 220 illustrated in FIG. 5 further includes a distributor 218, which is provided to achieve the synchronization of the turn-off gating voltages during the short-circuit fault. The distributor 218 receives the signals from the short-circuit detectors 214 and uses those to drive $V_{CC}$ regulators 216 for all the series-connected IGBTs to synchronously regulate $V_{CC}$ in response to any one of the IGBT short circuit detectors 214 determining that an IGBT is short circuited. That is to say, once a short circuit occurs to any one of the series-connected IGBTs, the distributor 218 activates the $V_{CC}$ regulators 216 for all the IGBTs to synchronously reduce their $V_{CC}$ values and enables all the IGBTs to be synchronously turned off. The distributor may comprise, for example, a central controller such as a complex programmable logic device (CPID), field-programmable gate array (FPGA), or a single chip microcomputer (SCM).

Reduction of the supply voltage $V_{CC}$ results in reduction of the short circuit current. As to a circuit including one or more series-connected IGBTs, the allowable energy and thermal losses sustained by the IGBTs under short circuit fault is proportional to the product of the voltage stress and the value of short circuit current. Reduction of the short circuit current can reduce thermal stresses applied on the IGBTs and thereby improve the durability and reliability of the IGBTs. Moreover, the reduction of short-circuit current decreases the di/dt during the turn-off transients when the protection is activated, significantly reducing the voltage stress applied on the IGBTs during the turn-off transients. As used herein, di/dt is the instantaneous rate of change of current with respect to time at a point, for example, at the point t=0. Thus, the IGBTs can be operated within a safe operating area (SOA) with sufficient margins.

In some cases where the short circuit fault is detected by comparing a detected voltage proportional to the collector-emitter voltage of the IGBT with a reference voltage, turning off of the IGBT may falsely trigger short-circuit protection because the IGBT in a turnoff status also has a relatively high collector-emitter voltage. In order to prevent false triggering of short-circuit protection due to the turning off of the IGBT, an IGBT on/off status detector may be added to the assembly or circuit, as described above, to determine whether the IGBT is turned on. In such embodiments, only when the IGBT is turned on will the $V_{CC}$ regulator reduce the $V_{CC}$ in response to the signal output by the IGBT short-circuit detector.

Figure 6:
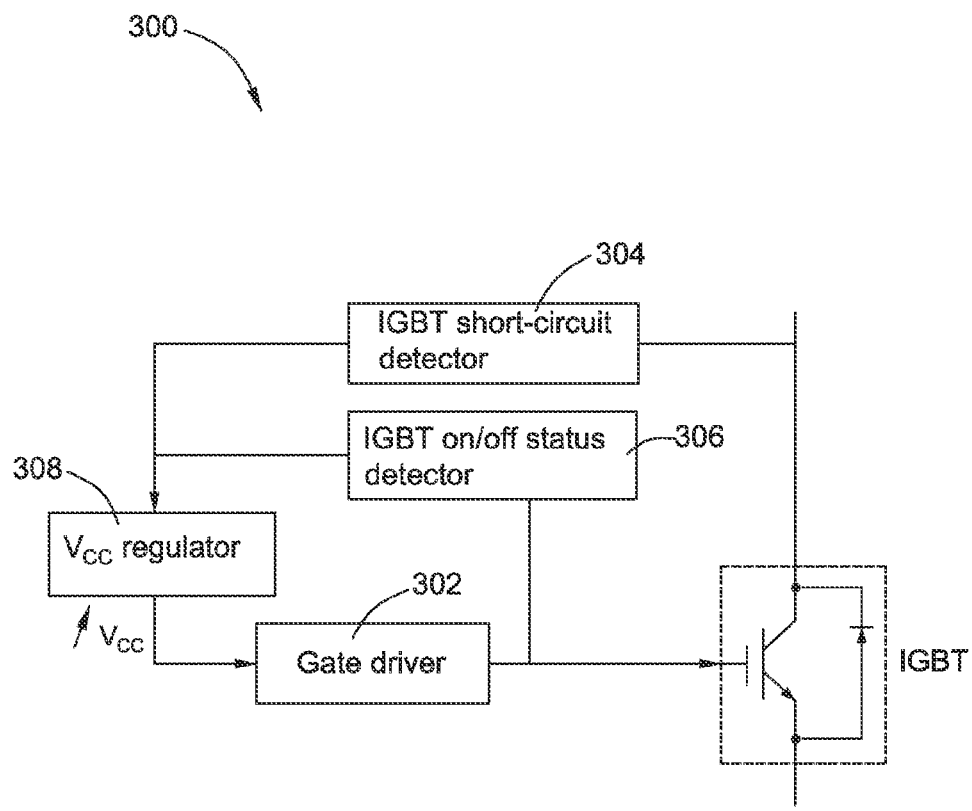
FIG. 6 is a circuit diagram of an exemplary assembly including an IGBT and a short-circuit protection circuit for protecting the IGBT against short-circuit failure, according to another embodiment.

For example, an IGBT on/off status detector may be added to an assembly similar to the one shown in FIG. 3 to provide an assembly 300 as illustrated in FIG. 6. In the assembly 300, a gate driver 302 is used to apply a supply voltage $V_{CC}$ to the gate terminal of the IGBT, an IGBT short-circuit detector 304 is used to determine whether a short-circuit fault occurs to the IGBT, an IGBT on/off status detector 306 is used to determine whether the IGBT is turned on, and a $V_{CC}$ regulator 308 is used to regulate $V_{CC}$ in response to the IGBT on/off status detector 306 determining that the IGBT is turned on and the IGBT short-circuit detector 304 determining that the IGBT is short-circuited.

The IGBT on/off status detector 306 may be a circuit capable of determining whether the IGBT is turned on by comparing a sensed voltage at a node coupled to the gate terminal of the IGBT with a reference voltage. Once the sensed voltage is below the reference voltage, a signal is given to indicate that the IGBT is turned on.

Figure 7:
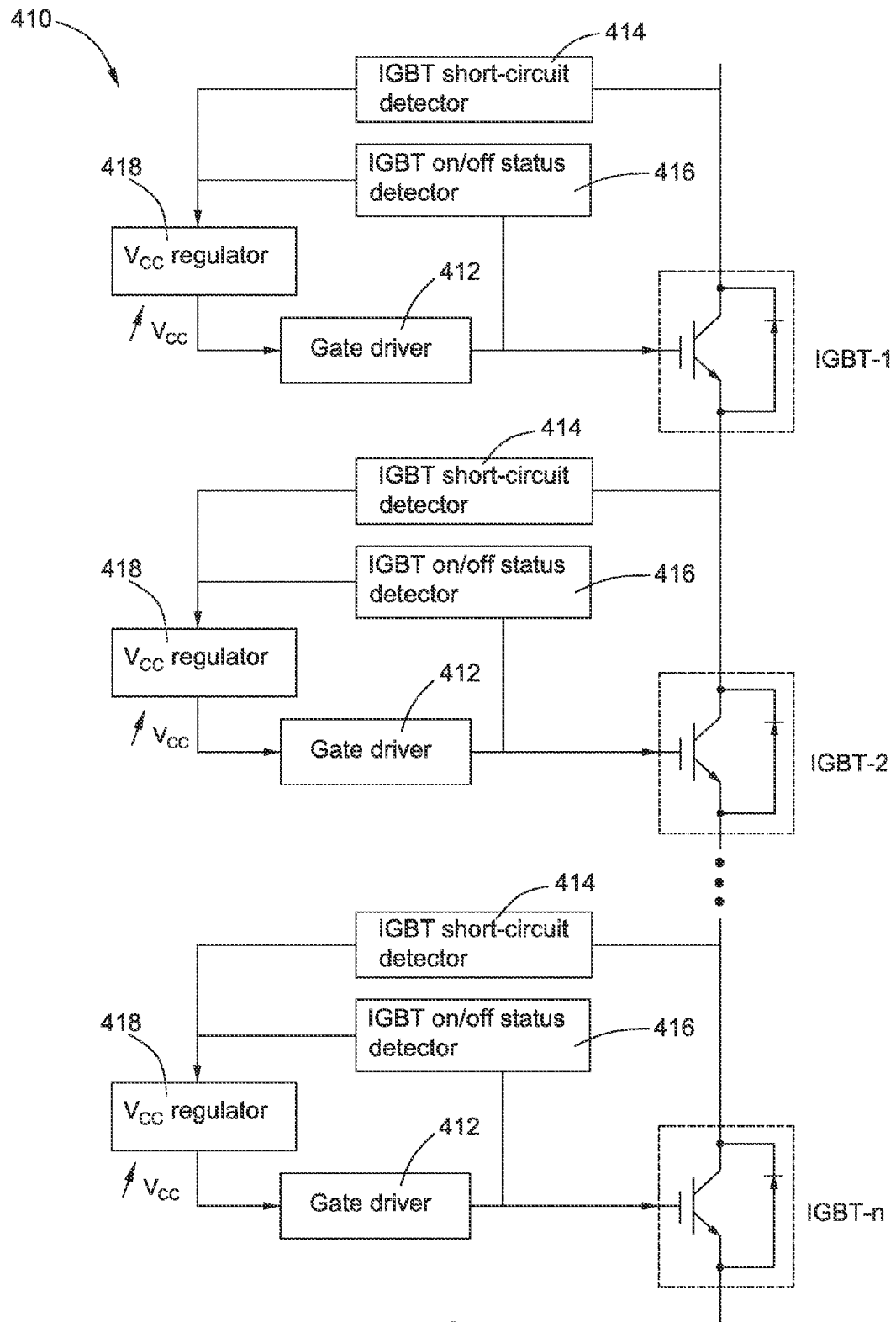
FIG. 7 is a circuit diagram of an exemplary assembly including series connected IGBTs, each of which is associated with a short-circuit protection circuit similar to that of FIG. 6.

An assembly 410 having two or more IGBTs connected in series, and each of which is associated with a short-circuit protection circuit including an IGBT on/off status detector, is illustrated in FIG. 7. In the assembly 410, IGBT-1, IGBT-2 . . . IGBT-n are connected in series, and each of the IGBTs is associated with a gate driver 412, and a short-circuit protection circuit including an IGBT short-circuit detector 414, an IGBT on/off status detector 416 and a $V_{CC}$ regulator 418, which are similar to these as described above.

Figure 8:
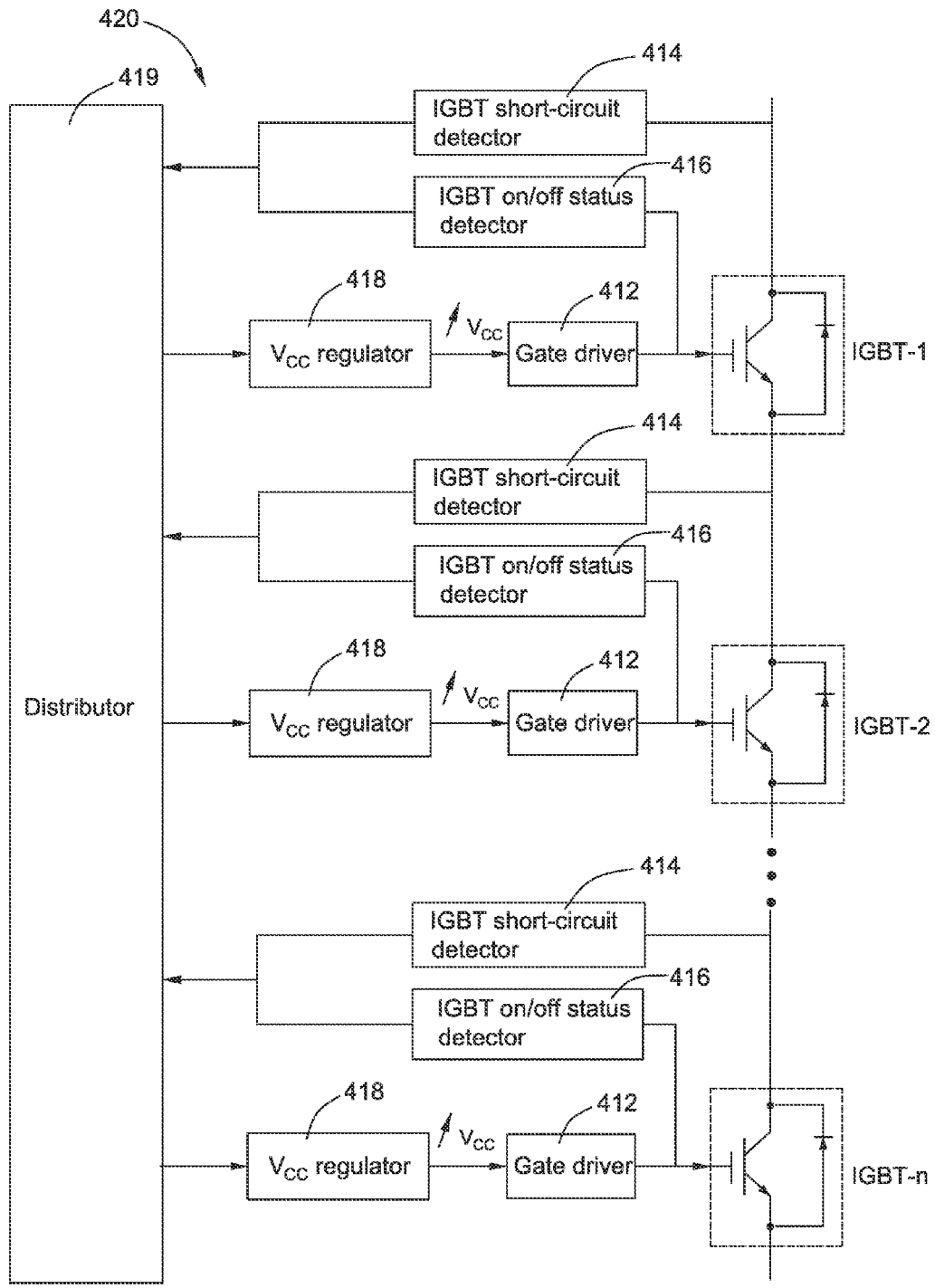
FIG. 8 is a circuit diagram of another exemplary assembly including series connected IGBTs, each of which is associated with a short-circuit protection circuit similar to that of FIG. 6.

In one embodiment, the protection circuits are used to provide the short-circuit protection for all the series-connected IGBTs of FIG. 7 at the same time. An example of such an embodiment is illustrated in FIG. 8. Compared with the assembly 410 of FIG. 7, an assembly 420 of FIG. 8 further includes a distributor 419, which is provided to achieve the synchronization of the turn-off gating voltages for all the IGBTs during the short-circuit fault. The distributor 419 is coupled to the IGBT short-circuit detectors 414, IGBT on/off status detectors 416, and $V_{CC}$ regulators 418 for all the IGBTs. The distributor 419 is able to drive the $V_{CC}$ regulators 418 for all the IGBTs to synchronously regulate $V_{CC}$ in response to a determination that any one of the IGBTs is turned on and short circuited. Once a short-circuit fault occurs to any IGBT in a turn-on status, the distributor 419 activates the $V_{CC}$ regulators 418 for all the IGBTs to synchronously regulate their $V_{CC}$ values. Therefore, it can be guaranteed that the short-circuit protection for all the series-connected IGBTs is triggered at the same time and the series-connected IGBTs are thus turned off at the same time during the short-circuit protection.

Figure 9:
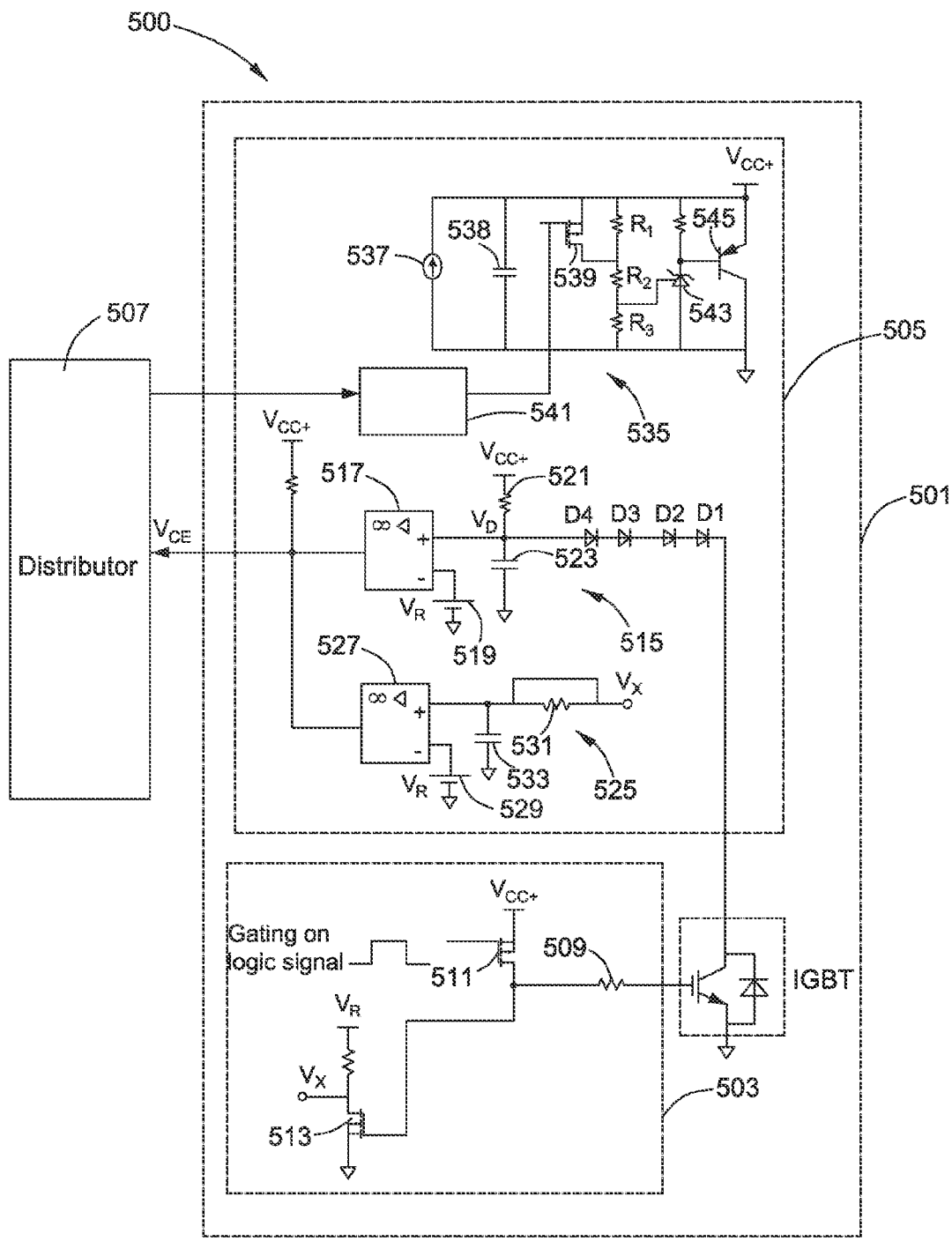
FIG. 9 is a detailed schematic view of an implementation of the assembly of FIG. 8, according to an embodiment.

FIG. 9 illustrates a detailed schematic view of an implementation of the assembly of FIG. 8 in accordance with one embodiment of the present disclosure. As shown in FIG. 9, an assembly 500 including a plurality of IGBT assemblies 501 is provided. Each of the IGBT assemblies 501 includes an IGBT, a gate driver 503 and a short-circuit protection circuit 505. The plurality of IGBT assemblies are commonly coupled to a distributor 507 adapted to synchronize short-circuit protection and turn-off for the different IGBTs. For clear illustration and ease of explanation, only one IGBT assembly 501 is shown in FIG. 9, and the other IGBT assemblies similar to the one shown are omitted.

In the illustrated IGBT assembly 501, the gate driver 503 is coupled to the gate terminal of the IGBT and applies a supply voltage to the gate terminal of the IGBT to turn on and off the IGBT. The gate driver 503 shown in FIG. 9 includes a turn-on resistor 509, a P-channel metal-oxide-semiconductor field-effect transistor (MOSFET) 511, and an N-channel MOSFET 513. During operation, when a gating on logic signal arrives, the P-channel MOSFET 511 conducts so that a supply voltage $V_{CC}$ drives through the turn-on resistor 509 to drive the IGBT. The emitter terminal of the IGBT is coupled to a reference ground. The collector terminal of the IGBT is coupled with a short-circuit detector 515, which detects whether the IGBT has been short circuited.

The short-circuit detector 515 includes a comparator 517. A non-inverting input of the comparator 517 is connected to the collector terminal of the IGBT through, for example, four series connected diodes D1, D2, D3 and D4, whereas an inverting input of the comparator 517 is connected to the reference ground through a reference voltage source 519. A pull-up resister 521 is connected between the supply voltage and the non-inverting input of the comparator 517. A capacitor 523 is connected between the non-inverting input end of the comparator 517 and the reference ground. An output of the comparator 517 is supplied to the distributor 507. The comparator 517 compares a detected voltage $V_D$ and a reference voltage generated by the reference voltage source 519. When the IGBT is not short-circuited, $V_D$ is about zero and is below the reference voltage, such that the comparator 517 outputs a negative signal indicating that the IGBT is not short-circuited. When the IGBT is short-circuited, the collector-to-emitter voltage of the IGBT increases to a level approaching the DC-link voltage. The diodes D1, D2, D3 and D4 are reverse biased. The capacitor 523 is charged and $V_D$ will exponentially increase to $V_{CC}$. When $V_D$ increases to a comparative threshold value that equals to the reference voltage, the comparator 517 outputs a positive signal indicating that the IGBT is short-circuited.

An on/off status detector 525 is coupled to a node at a drain terminal of the N-channel MOSFET 513 (with a voltage of $V_X$). The on/off status detector 525 includes a comparator 527. A non-inverting input of the comparator 527 is connected to a resistor 531, whereas an inverting input of the comparator 527 is connected to the reference ground through a reference voltage source 529. The reference voltage source 529 generates a reference voltage for comparison. A capacitor 533 is connected between the non-inverting input of the comparator 527 and the reference ground. An output of the comparator 527 is supplied to the distributor 507. When a gating-on voltage is applied, the P-channel MOSFET 511 conducts to turn on the IGBT. The supply voltage $V_{CC}$ is coupled to the gate end of the N-channel MOSFET 513 resulting in the turn-on of the N-channel MOSFET 513. Therefore $V_X$ is about zero and is below the reference voltage generated by the reference voltage source 529, such that the comparator 527 outputs a positive signal indicating the IGBT is turned on. When a gating-off voltage is applied and thereby the IGBT is turned off, $V_X$ substantially equals the supply voltage $V_{CC}$ and is above the reference voltage generated by the reference voltage source 529, such that the comparator 527 outputs a negative signal indicating the IGBT is turned off.

The distributor 507 has an output coupled to a $V_{CC}$ regulator 535. The $V_{CC}$ regulator 535 includes a DC current source 537, a capacitor 538, a controllable electronic switch 539, a switch driver 541, a voltage reference generator 543, resistors R1, R2 and R3, and a transistor 545. The voltage reference generator 543 generates a voltage reference value $V_K$. In the illustrated embodiment, the switch driver 541 is coupled to the output of distributor 507, which receives a signal from the output of distributor 507 and drives the switch 539 that is in parallel with the resistor R1 to switch between an on-status and an off-status. When the switch 539 is off, the supply voltage $V_{CC}$ can be calculated as:

$$V_{CC}=V_K*(R1+R2+R3)/R3$$

When the switch 539 is on, the supply voltage $V_{CC}$ can be calculated as:

$$V_{CC}=V_K*(R2+R3)/R3$$

Since the voltage reference value $V_K$ is kept unchanged, the change of the voltage divider ratio ((R1+R2+R3)/R3 or (R2+R3)/R3) eventually changes the supply voltage $V_{CC}$ for driving turn-on gate voltage for IGBT. By choosing appropriate values for R1, R2 and/or R3, the regulated output supply voltage $V_{CC}$ can be changed from the linear regulated power supply. Thus, the $V_{CC}$ regulator is able to regulate the supply voltage $V_{CC}$ between a relatively higher value and a relatively smaller value, and the $V_{CC}$ can be reduced in response to a determination that a short circuit is occurring in a turned on IGBT. Since short-circuit current level of the IGBT is lower when the gate voltage $V_{CC}$ is reduced according to the IGBT characteristics, the short circuit current of the IGBT can be significantly reduced by reducing the $V_{CC}$.

The other IGBT assemblies (not shown) are coupled to the distributor 507 in a similar way. Once comparators of both a short-circuit detector and an on/off status detector of any one of the IGBT assemblies output positive signals, indicating that the IGBT of that IGBT assembly is turned on and short-circuited, the distributor 507 drives $V_{CC}$ regulators of all the IGBT assemblies to synchronously reduce $V_{CC}$ to protect the IGBTs against a short-circuit failure.

Figure 10:
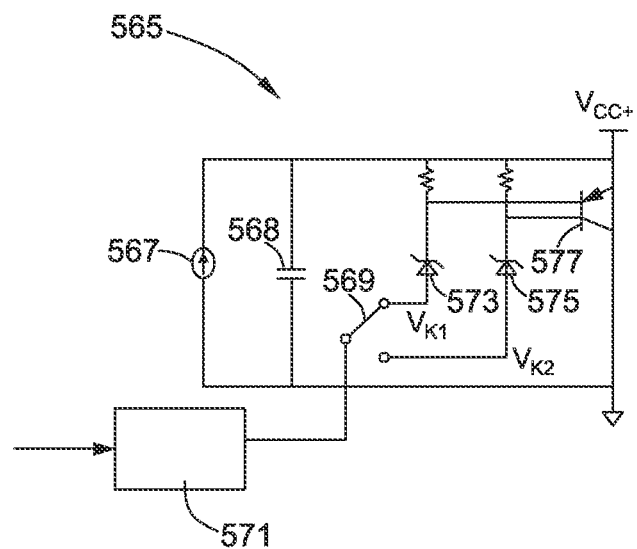
FIG. 10 is a circuit diagram of an implementation of a $V_{CC}$ regulator according to an embodiment, which is different from that of FIG. 9.

As to the $V_{CC}$ regulator, there may be various implementations. For example, the $V_{CC}$ regulator 535 in the assembly 500 may be replaced with another $V_{CC}$ regulator 565 as shown in FIG. 10. The $V_{CC}$ regulator 565 includes a DC current source 567, a capacitor 568, a controllable electronic switch 569, a switch driver 571, and at least two voltage reference generators 573 and 575, and a transistor 577. The switch driver 571 drives the switch 569 to switch between the voltage reference generators 573 and 575, which provide relatively higher and lower voltage reference values $V_{K1}$ and $V_{K2}$, respectively. A higher voltage reference value generates a relatively higher supply voltage $V_{CC}$. Therefore, by designing the voltage reference generators 573 and 575 to provide appropriate higher and lower voltage reference points, the supply voltage $V_{CC}$ can be regulated between a higher value and a lower value, which are suitable for IGBT under a normal operation and a short circuit condition, respectively. Once a short circuit is sensed, the $V_{CC}$ regulator 565 can be operated to choose the lower $V_{CC}$.

Figure 11:
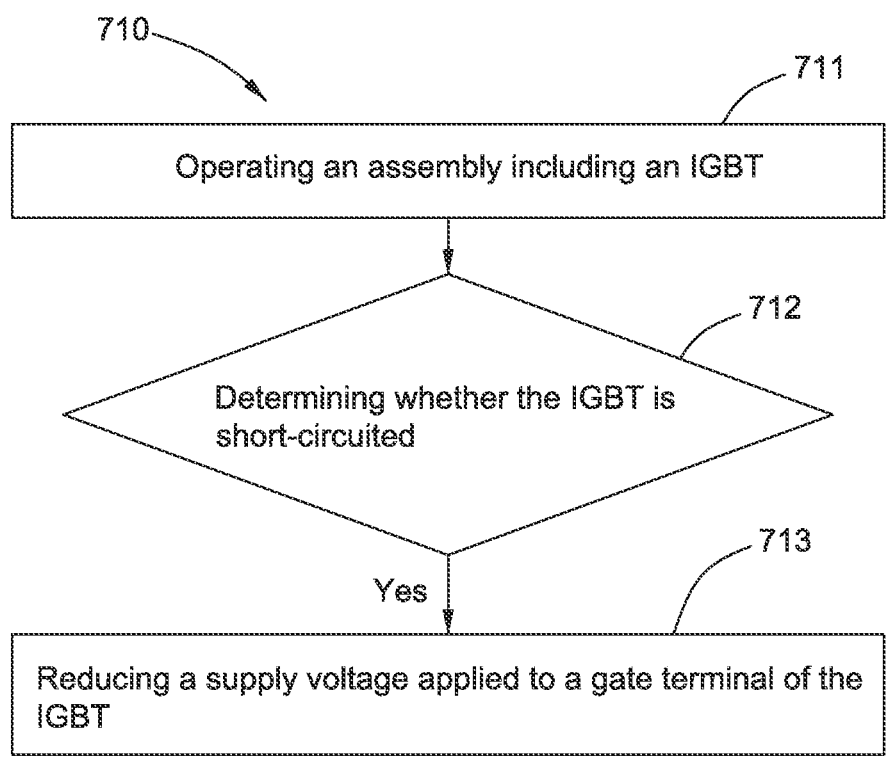
FIG. 11 is a flowchart illustrating a method for operating an assembly including an IGBT, according to one embodiment.

In another aspect, methods for operating the IGBT assemblies described above to protect an IGBT against short circuit conditions are also provided. FIG. 11 illustrates a flowchart of a method 710 for operating the IGBT assembly 100 shown in FIG. 1 to protect the IGBT against short circuit conditions in accordance with one embodiment of the present disclosure. In the method 710, an assembly including an IGBT is operated in step 711. A parameter of the IGBT is sensed to determine whether the IGBT is short-circuited in step 712. A supply voltage applied to a gate terminal of the IGBT is reduced in step 713 if it is found that the IGBT is short-circuited based on the result of step 712.

Figure 12:
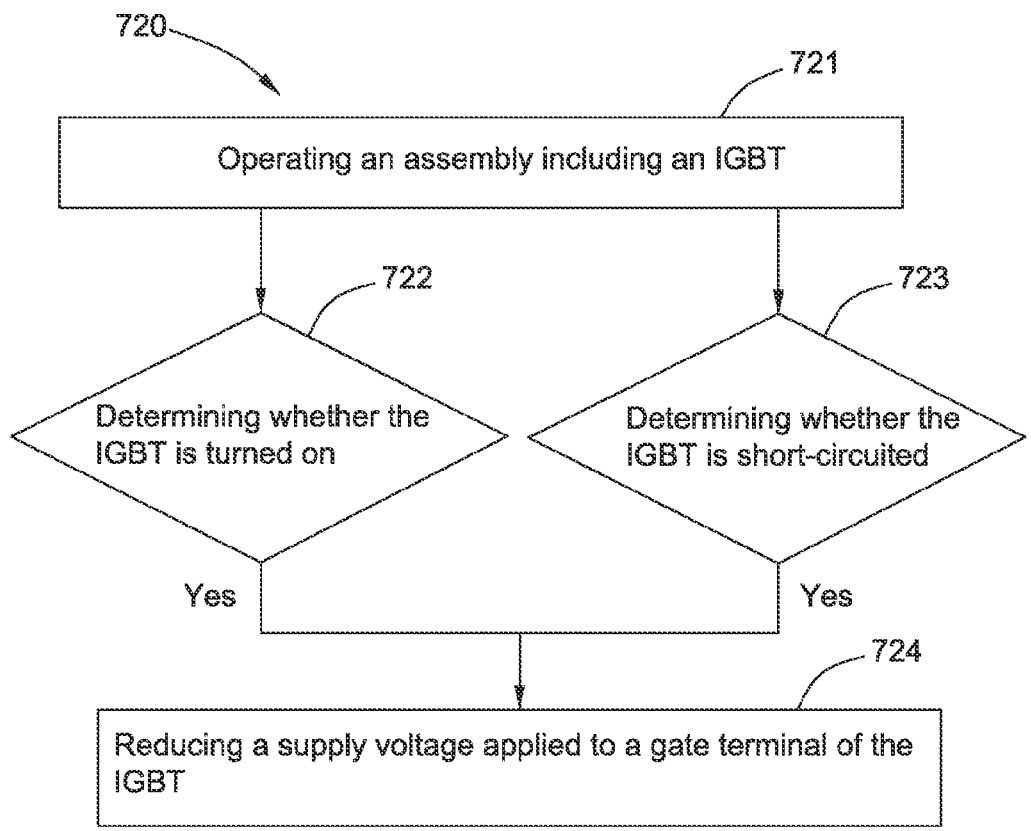
FIG. 12 is a flowchart illustrating a method for operating an assembly including an IGBT, according to another embodiment.

FIG. 12 illustrates a flowchart of a method 720 for operating the IGBT assembly 300 shown in FIG. 6 to protect the IGBT against short circuit conditions in accordance with one embodiment of the present disclosure. In the method 720, an assembly including an IGBT is operated in step 721. A parameter of the IGBT is sensed to determine whether the IGBT is turned on in step 722. It is determined whether the IGBT is short-circuited in step 723. A supply voltage applied to a gate terminal of the IGBT is reduced in step 724 if it is found that the IGBT is turned on and short-circuited based on the results of steps 722 and 723.

Figure 13:
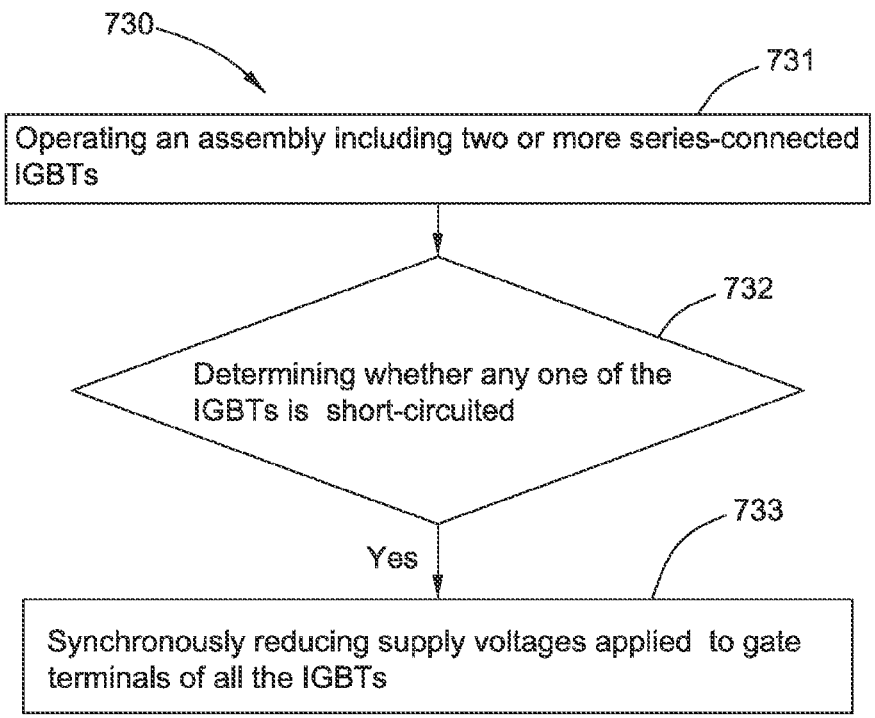
FIG. 13 is a flowchart illustrating a method for operating an assembly including a plurality of series-connected IGBTs, according to one embodiment.

FIG. 13 illustrates a flowchart of a method 730 for operating the assembly 220 shown in FIG. 5 to protect the IGBTs of the assembly against short circuit conditions in accordance with one embodiment of the present disclosure. In the method 730, the assembly including a plurality of series-connected IGBTs is operated in step 731. Each of the IGBTs is evaluated to determine whether any one of the IGBTs is short-circuited in step 732. Supply voltages applied to all the IGBT are synchronously reduced in step 733 if it is found that any one of the IGBTs is short-circuited based on the result of step 732.

Figure 14:
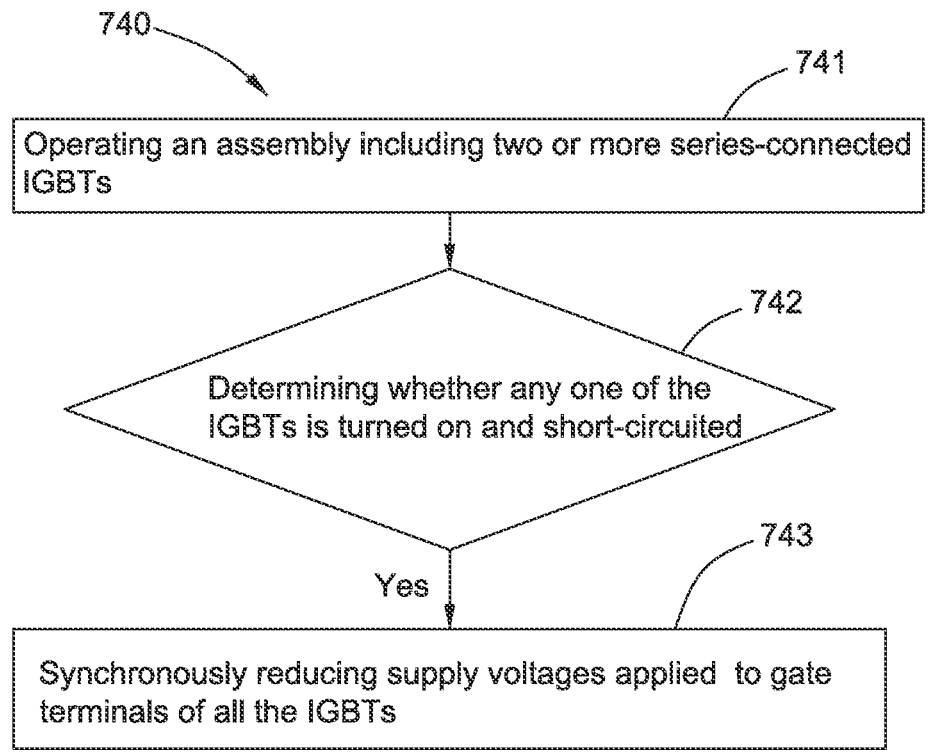
FIG. 14 is a flowchart illustrating a method for operating an assembly including a plurality of series-connected IGBTs, according to another embodiment.

FIG. 14 illustrates a flowchart of a method 740 for operating the assembly 420 shown in FIG. 8 to protect the IGBTs of the assembly against short circuit conditions in accordance with one embodiment of the present disclosure. In the method 740, the assembly including a plurality of series-connected IGBTs is operated in step 741. Each of the IGBTs is evaluated to determine whether any one of the IGBTs is turned on and short-circuited in step 742. Supply voltages applied to all the IGBT are synchronously reduced in step 743 if it is found that any one of the IGBTs is turned on and short-circuited based on the result of step 742.

To demonstrate the effectiveness of the proposed short circuit protection scheme, experiments were conducted to compare the short circuit behavior of an IGBT without a short circuit protection circuit and the short circuit behavior of an IGBT with a short circuit protection circuit as described above.

Figure 15:
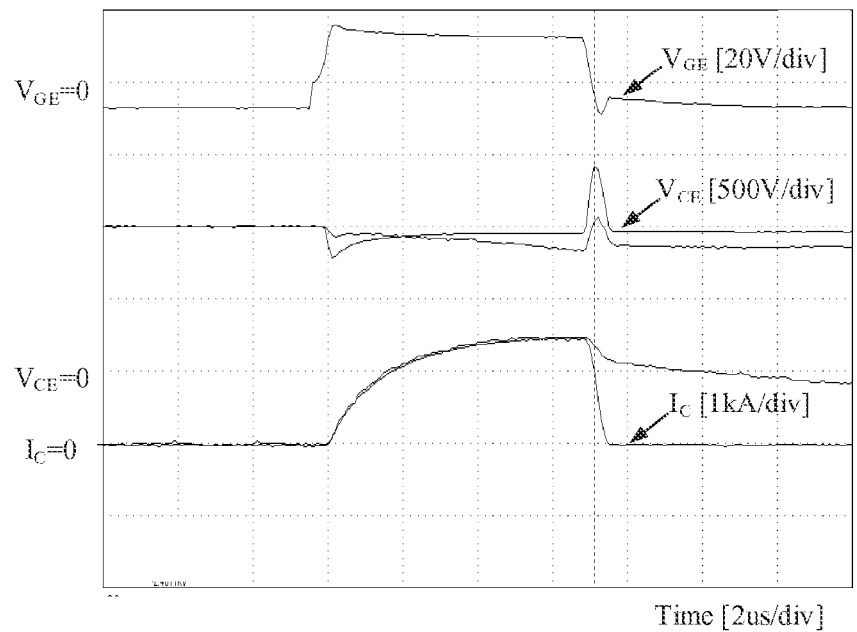
FIG. 15 shows short-circuit behavior of an IGBT without short-circuit protection.
Figure 16:
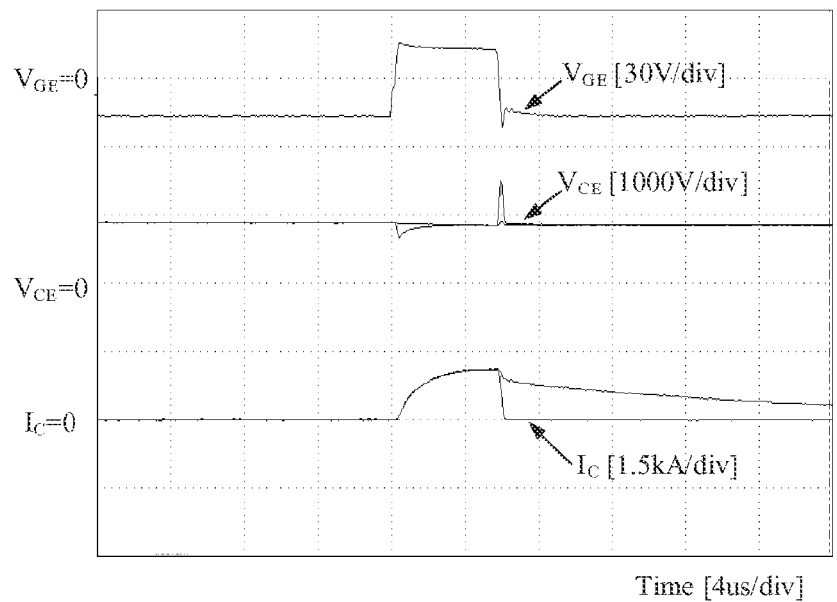
FIG. 16 shows short circuit behavior of IGBT with a short-circuit protection circuit in accordance with an exemplary embodiment of the present disclosure.

FIG. 15 shows the short circuit behavior of an Infineon 1700V/450A IGBT without short circuit protection. It can be seen that the voltage across the IGBT ($V_{CE}$) is approximately 900V and while the short circuit current is around 1750 A during the short circuit fault. After about 7.3 us, the IGBT is turned off. The voltage across the IGBT is up to about 1545V due to the large di/dt during turn-off transients. FIG. 16 shows the short circuit behavior of an Infineon 1700V/450 A IGBT with a proposed short circuit protection circuit. Due to the reduction of the gate voltage, the short circuit current is decreased to 1050 A at the steady state, indicating that there would be about a 40% reduction of thermal losses for the IGBT during such a short-circuit fault condition. After the gating on voltage lasts for around 7 us, the IGBT is turned off. Since the short circuit current is reduced to a lower level, the voltage spike applied across the IGBT is reduced to 1428V. Therefore, the IGBT is protected within its SOA with enough margins.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed or the best mode contemplated for carrying out this invention, but that the invention will include all embodiments falling within the scope of the appended claims.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

What is claimed is:

1. An assembly comprising:
    an insulated gate bipolar transistor (IGBT);
    a gate driver configured to supply voltage to a gate terminal of the IGBT; and
    a short-circuit protection circuit comprising:
        an IGBT short-circuit detector configured to determine whether the IGBT is short-circuited; and
        a supply voltage regulator configured to regulate the supply voltage in response to a determination by the IGBT short-circuit detector that the IGBT is short-circuited, the supply voltage regulator comprising a circuit having a power source supplying a constant current.

2. The assembly of claim 1, wherein the supply voltage regulator is configured to reduce the supply voltage in response to a determination by the IGBT short-circuit detector that the IGBT is short circuited.

3. The assembly of claim 1, wherein the IGBT further comprises a first IGBT, the gate driver comprises a first gate driver, and the short-circuit protection circuit comprises a first short-circuit protection circuit, the assembly further comprising:
    a second IGBT;
    a second gate driver; and
    a second short-circuit protection circuit,
    wherein the first and second IGBTs are connected in series.

4. The assembly of claim 3, further comprising a distributor configured to cause the first and second short-circuit protection circuits to synchronously reduce supply voltages in response to a determination that any one of the first and second IGBTs is short circuited.

5. The assembly of claim 1, wherein the short-circuit protection circuit further comprises an IGBT on/off status detector configured to determine if the IGBT is turned on, and wherein the supply voltage regulator is configured to reduce the supply voltage in response to both a determination by the IGBT short-circuit detector that the IGBT is short-circuited and a determination by the on/off status detector that the IGBT is turned on.

6. The assembly of claim 5, wherein the IGBT on/off status detector comprises a circuit configured to determine whether the IGBT is turned on by comparing a sensed voltage at a node coupled to the gate terminal of the IGBT with a reference voltage.

7. The assembly of claim 5, wherein the IGBT further comprises a first IGBT, the gate driver comprises a first gate driver, and the short-circuit protection circuit comprises a first short-circuit protection circuit, and the assembly further comprises: a second IGBT, a second gate driver, and a second short-circuit protection circuit, wherein the first and second IGBTs are connected in series.

8. The assembly of claim 7, further comprising: a distributor configured to cause the first and second short-circuit protection circuits to synchronously reduce supply voltages in response to a determination that the first IGBT or second IGBT is turned on and short circuited.

9. The assembly of claim 1, wherein the IGBT short-circuit detector further comprises a circuit configured to determine whether the IGBT is short-circuited by comparing a detected voltage that is proportional to a collector-emitter voltage of the IGBT with a reference voltage.

10. The assembly of claim 9, wherein the IGBT short-circuit detector further comprises:
    at least one diode;
    at least one resistor;
    at least one capacitor; and
    at least one comparator.

11. The assembly of claim 1, wherein the supply voltage regulator further comprises at least two voltage reference generators configured to provide relatively higher and lower voltage reference values for generating relatively higher and lower supply voltages respectively.

12. The assembly of claim 1, wherein the supply voltage regulator further comprises a voltage divider configured to obtain more than one voltage from a single power source.

13. A method for protecting an insulated gate bipolar transistor (IGBT) against short circuit conditions, the method comprising:
    determining whether the IGBT is short-circuited; and
    reducing a supply voltage applied to a gate terminal of the IGBT in response to a determination that the IGBT is short-circuited, including reducing the supply voltage based on a constant current provided by a power source.

14. The method of claim 13, wherein determining whether the IGBT is short-circuited comprises determining whether the IGBT is turned on, the method further comprising reducing the supply voltage in response to a determination that the IGBT is turned on and short-circuited.

15. The method of claim 14, wherein determining whether the IGBT is turned on comprises comparing a sensed voltage at a node coupled to the gate terminal of the IGBT with a reference voltage.

16. The method of claim 13, wherein determining whether the IGBT is short-circuited is comprises comparing a detected voltage that is proportional to a collector-emitter voltage of the IGBT with a reference voltage.

* * * * *